Figure 1:
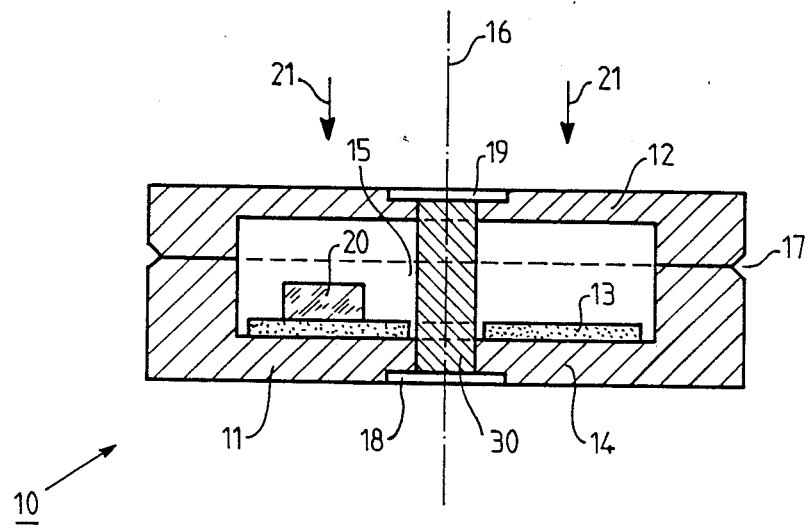

United States Patent [19]

Doyen et al.

[11] Patent Number: 4,873,495

[45] Date of Patent: Oct. 10, 1989

[54] ULTRAHIGH-FREQUENCY OSCILLATOR HAVING A DIELECTRIC RESONATOR STABLE WITH RESPECT TO MECHANICAL VIBRATIONS

[75] Inventors: Daniel Doyen, Limeil-Brevannes; Tarcisio Vriz, Montgeron, both of France

[73] Assignee: U.S. Philips Corporation, New York, N.Y.

[21] Appl. No.: 238,689

[22] Filed: Aug. 30, 1988

[30] Foreign Application Priority Data

Sep. 4, 1987 [FR] France ................................. 87 12278

[51] Int. Cl.$^4$ ............................................... H03B 5/18
[52] U.S. Cl. ........................................ 331/68; 331/96; 333/219.1
[58] Field of Search .................... 331/68, 96, 107 DP, 331/107 SL, 117 D; 333/219.1, 227, 228; 361/399

[56] References Cited

U.S. PATENT DOCUMENTS 4,628,283 12/1986 Reynolds ......................... 331/96 X
4,710,729 12/1987 Doyen et al. ..................... 331/68 X Primary Examiner—Siegfried H. Grimm

[57] ABSTRACT

An ultrahigh-frequency oscillator (10) stabilized by a dielectric resonator (20) comprising a housing (11) closed by a cover (12) and having a circuit (13) including a dielectric resonator (20) fixed in the bottom (14) of the housing (11). According to the invention, a small column (30) situated in the central part (15) of the housing (11) rigidly connects the bottom (14) of the housing (11) to the cover (12), the dielectric resonator (20) being arranged outside the said central part (15).

2 Claims, 1 Drawing Sheet

ULTRAHIGH-FREQUENCY OSCILLATOR HAVING A DIELECTRIC RESONATOR STABLE WITH RESPECT TO MECHANICAL VIBRATIONS

The invention relates to an ultrahigh-frequency oscillator stabilized by a dielectric resonator comprising a housing closed by a cover and having a circuit including a dielectric resonator fixed in the bottom of the housing.

As has been stated in French patent application No. 2,587,152 filed by the Applicant, the development of a new material having a high dielectric constant (barium or zirconium titanate) and exhibiting very low ultrahigh-frequency losses and temperature coefficients which are zero or slightly positive, has led to the realization of a new generation of ultrahigh-frequency oscillators: the oscillators stabilized by a dielectric resonator. These oscillators operate at a fixed or slightly adjustable frequency and are characterized by a high stability of frequency and of output level as a function of temperature, a high electric efficiency due to the use of field effect transistors, a high spectral purity and the possibility of using the micro-strip technology permitting of obtaining a small weight and a small volume. This type of oscillators has numerous applications in instrumentation, telecommunication, radar, etc. In certain applications, a given spectral purity of the ultrahigh-frequency signal must be maintained during the occurrence of aleatory vibrations.

Also the general technical problem to be solved for every ultrahigh-frequency oscillator stabilized by a dielectric resonator is to reduce to a minimum the effect of mechanical vibrations on the oscillation frequency. The mounting technology must therefore be adapted to these limitations and more particularly the dielectric resonator must be firmly fixed on its circuit and the metal and dielectric environment of this resonator must be very rigid and stable because every variation of the metallic or dielectric surfaces surrounding the dielectric resonator produces variations of the oscillation frequency. Especially the distance h between the dielectric resonator and the cover of the housing is very critical in this respect. The Applicant has shown, for example, that for a distance h of 3 mm a simple differential variation $\Delta h$ of a few tens of $10^{-3}$ $\mu m$ gave rise to a degradation of the phase noise of about 15 dB at 1 kHz of the frequency of the oscillator centered at 14 GHz. Therefore, it is important to design an extremely rigid housing which cannot be obtained only by increasing the metallic thicknesses unless the weight and the volume of the housing are increased in a disadvantageous manner.

French patent application No. 2,587,152 proposes as a solution for the general technical problem mentioned to subject the housing to flexion with the aid of carrier means when it is fixed and locked on its support. Thus, the housing offers a high rigidity and a lower sensitivity to the vibrations of the support. However, this known solution has the disadvantage that it can be carried out only with difficulty because it requires accurate controlling steps especially with regard to clamping the housing on the said carrying means.

The technical problem to be solved by the means in accordance with the invention is precisely to realize an ultra-high-frequency oscillator stabilized by a dielectric resonator comprising a housing closed by a cover and having a circuit including a dielectric resonator fixed in the bottom of the housing, which ultrahigh-frequency oscillator is stable with respect to mechanical vibrations and can readily operate.

For this purpose, the solution of the problem mentioned consists according to the present invention in that a column situated in the central part of the housing rigidly connects the bottom of the housing to the cover and in that the dielectric resonator is arranged outside the said central part.

In this manner, the maximum amplitude of the vibrations of the cover of the housing is considerably reduced whilst increasing its resonance frequency. On the other hand, as will be explained hereinafter in detail, the small column can be positioned in a simple manner without accurate controlling steps being required.

In order that the invention may be readily carried out, it will now be described more fully, by way of example, with reference to the accompanying drawing, in which:

FIG. 1 is a sectional view of an ultrahigh-frequency oscillator according to the invention.

FIG. 1 is a sectional view of an ultrahigh-frequency oscillator 10 stabilized by a dielectric resonator 20. The ultrahigh-frequency oscillator 10 in FIG. 1 comprises a housing 11 closed by a cover 12, the housing and the cover in this case having a circular form with an axis 16. Within the housing 11 is situated a circuit 13 including a dielectric resonator 20 fixed in the bottom 14 of the said housing. This circuit 13 is advantageously realized by means of the micro-strip technology on a substrate of, for example, alumina. The housing 11 and the cover 12 constitute the ultrahigh-frequency cavity of the oscillator 10.

The housing 11 and the cover 12 are obtained in a very rigid manner in order that under the influence of vibrations applied to the oscillator 10 the mechanical environment of the dielectric resonator 20, which participates in the determination of the oscillation frequency, varies to the smallest possible extent. However, as indicated above, the ultrahigh-frequency oscillator 10 of FIG. 1 nevertheless remains extremely sensitive to the vibrations of the support applied in the direction of the axis 16, i.e. perpendicularly to the surface of the circuit 13. In order to reduce this sensitivity, it is ensured, as shown in FIG. 1, that a small column 30 is situated in the central part 15 of the housing 11, i.e. in this case in the vicinity of the axis 16, and rigidly connects the bottom 14 of the housing to the cover 12. The dielectric resonator 20 is then arranged outside the central part 15 of the housing. This arrangement permits of blocking the vibrations in the central part of the housing 11 and of limiting their amplitude outside this part, where the dielectric resonator 20 is located. In the same manner, the resonance frequency of the cover is increased.

The Applicant has shown by experiments with an oscillator having a dielectric resonator operating in the Ku band that, after having measured a noise of $-66$ dBc/Hz at 1 kHz of the carrier in the absence of vibrations, the said noise still had a value of only $-60$ dBc/Hz when vibrations of 13 g in the band of 20-2000 Hz were applied to the oscillator.

In a practical manner, the hole in the alumina substrate of the circuit 13 necessary for the passage of the small column 30 can be obtained by laser cutting or by ultrasonic waves. The cover 12 is welded on the housing 11 at the area of the peripheral recess 17 formed by the bevelled edges of the cover and of the housing. The small column 30 is then positioned by forced fitting and is subsequently welded by laser welding to the housing 11 and to the cover 12 at the area of the hollow parts 18 and 19, respectively. Thus, the air-tightness of the cavity of the ultrahigh-frequency oscillator is also ensured. In order to further reduce the vibrations, during the operation of mounting the small column 30, the cover 12 can be prestressed by exerting a pressure on this cover in the direction of the arrows 21 by means of, for example, a bracket.

What is claimed is:

1. An ultrahigh-frequency oscillator (10) stabilized by a dielectric resonator (20) comprising a housing (11) closed by a cover (12) and having a circuit (13) including a dielectric resonator (20) fixed in the bottom (14) of the housing (11), characterized in that a column (30) situated in the central part (15) of the housing (11) rigidly connects the bottom (14) of the housing (11) to the cover (12), and in that the dielectric resonator (20) is arranged outside the said central part (15).

2. An ultrahigh-frequency oscillator as claimed in claim 1, characterized in that the cover (12) is prestressed.

* * * * *